United States Patent
Tasic et al.

(10) Patent No.: US 8,368,434 B2
(45) Date of Patent: Feb. 5, 2013

(54) DIFFERENTIAL QUADRATURE DIVIDE-BY-THREE CIRCUIT WITH DUAL FEEDBACK PATH

(75) Inventors: Aleksandar M. Tasic, San Diego, CA (US); Junxiong Deng, San Diego, CA (US); Dongjiang Qiao, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 246 days.

(21) Appl. No.: 12/836,774

(22) Filed: Jul. 15, 2010

(65) Prior Publication Data

US 2011/0200161 A1 Aug. 18, 2011

Related U.S. Application Data

(60) Provisional application No. 61/305,182, filed on Feb. 17, 2010.

(51) Int. Cl.
*H03K 21/00* (2006.01)
(52) U.S. Cl. ............................ 327/115; 327/117; 377/47
(58) Field of Classification Search .................... 327/48, 327/115, 117, 118; 377/47, 48
See application file for complete search history.

(56) References Cited

U.S. PATENT DOCUMENTS

| | | | |
|---|---|---|---|
| 5,425,074 A | 6/1995 | Wong | |
| 6,389,095 B1 * | 5/2002 | Sun | 377/48 |
| 6,459,310 B1 | 10/2002 | Thomson et al. | |
| 6,822,491 B1 * | 11/2004 | Glass | 327/115 |
| 7,535,277 B2 * | 5/2009 | Suzuki | 327/254 |
| 2002/0043993 A1 * | 4/2002 | Tam et al. | 327/115 |
| 2008/0297209 A1 * | 12/2008 | Scuteri | 327/115 |

FOREIGN PATENT DOCUMENTS

WO WO0229973 A2 4/2002

OTHER PUBLICATIONS

International Search Report and Written Opinion—PCT/US2011/024942, ISA/EPO—May 24, 2011.

* cited by examiner

*Primary Examiner* — Hai L Nguyen
(74) *Attorney, Agent, or Firm* — S. Hossain Beladi

(57) ABSTRACT

A divide-by-three circuit includes a chain of three dynamic flip-flops and a feedback circuit of combinatorial logic. The divide-by-three circuit receives a clock signal that synchronously clocks each dynamic flip-flop. The feedback circuit supplies a feedback signal onto the first dynamic-flop of the chain. In a first mode, a signal from a slave stage of the first flip-flop and a signal from a slave stage of the second flip-flop are used by the feedback circuit to generate the feedback signal. In a second mode, a signal from a master stage of the first flip-flop and a signal from a master stage of the second flip-flop are used by the feedback circuit to generate the feedback signal. By proper selection of the mode, the frequency range of the overall divider is extended. Combinatorial logic converts thirty-three percent duty cycle signals from the flip-flop chain into fifty percent duty cycle quadrature signals.

16 Claims, 16 Drawing Sheets

DIVIDE-BY-THREE CIRCUIT WITH DUAL FEEDBACK PATH

DIVIDE-BY-THREE CIRCUIT WITH DUAL
FEEDBACK PATH

SIGNAL PATH EXTENDING THROUGH
CHAIN OF DYNAMIC FLIP-FLOPS

DYNAMIC FLIP-FLOP CIRCUIT

FEEDBACK CIRCUIT

INVERTER OF THE FEEDBACK CIRCUIT

DIFFERENTIAL QUADRATURE (Q) CIRCUIT
WITH COARSE DELAY CIRCUITRY

COARSE DELAY CIRCUIT

DIFFERENTIAL IN-PHASE (I) CIRCUIT

FINE TUNE DELAY FEEDBACK CIRCUIT

SLOW MODE SIGNAL PATH

SLOW MODE OPERATION WITH 9-STAGE
FEEDBACK (FSPDCS = 0) AT 2.0 GHZ

FAST MODE SIGNAL PATH

DIFFERENTIAL QUADRATURE DIVIDE-BY-THREE CIRCUIT WITH DUAL FEEDBACK PATH

CROSS REFERENCE TO RELATED APPLICATION

This application claims the benefit under 35 U.S.C. §119 of provisional application Ser. No. 61/305,182, entitled "Differential Quadrature Divide-By-Three Circuit With Dual Indirect Feedback Path", filed Feb. 17, 2010. The subject matter of provisional application Ser. No. 61/305,182 is incorporated herein by reference.

BACKGROUND INFORMATION

1. Technical Field

The disclosed embodiments relate generally to frequency dividers, including high-speed frequency dividers operable in wireless communication systems.

2. Background Information

State-of-the-art divide-by-three circuits for Radio Frequency (RF) transceivers of cellular telephones are typically designed in a single-ended fashion. Such single-ended designs have several disadvantages. In one example, they have a poor power-supply rejection that results in poor isolation between a transmit signal path (Tx) and a receive signal path (Rx). Because of this poor Tx-to-Rx isolation, downconverted receive signals may be corrupted (and the receiver's signal-to-noise ratio degraded), and phone calls may be lost. In order to drive state-of-the-art double-balanced mixers, differential quadrature Local Oscillator (LO) signals are generated by inverting the divider output signals. The differential signals generated may be unbalanced as they undergo different physical paths (with different delays that are hard to control). This creates a strong common-mode component at the output of the mixer that degrades the receiver's second-order input-intercept point (IIP2) and signal-to-noise ratio accordingly. In another example, divide-by-three circuits may fail when operating in certain frequency ranges.

SUMMARY

A divide-by-three circuit includes a chain of three dynamic flip-flops and a feedback circuit of combinatorial logic. The divide-by-three circuit receives a clock signal that synchronously clocks each dynamic flip-flop of the chain. The feedback circuit outputs a feedback signal that is supplied onto the D input of the first dynamic flip-flop of the chain. Each dynamic flip-flop includes a master portion and a slave portion.

In one embodiment, the feedback circuit is a dual feedback path. In a first mode (slow mode or nine-stage mode), a signal from the slave stage of the first flip-flop and a signal from the slave stage of the second flip-flop are used by the feedback circuit to generate the feedback signal. In one example, the divide-by-three circuit is operable in the first mode over a frequency range from approximately 1.7 GHz to approximately 2.0 GHz. In a second mode (fast mode or seven-stage mode), a signal from the master stage of the first flip-flop and a signal from the master stage of the second flip-flop are used by the feedback circuit to generate the feedback signal. In another example, the divide-by-three circuit is operable in the second mode over a frequency range from approximately 2.0 GHz to approximately 2.5 GHz. In both modes, the divide-by-three circuit generates an output signal with a frequency that is one-third the frequency of the input clock signal. By proper selection of the mode, the frequency range of the overall divide-by-three circuit is extended to range from 1.7 GHz to 2.5 GHz.

In another embodiment, a divide-by-three circuit includes combinatorial logic circuitry that receives signals from locations along the dynamic flip-flop chain. The signals output by the flip-flop chain have thirty-three percent duty cycles. The combinatorial logic circuitry converts these thirty-three percent duty cycle signals into fifty percent duty cycle quadrature signals I, IB, Q and QB.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
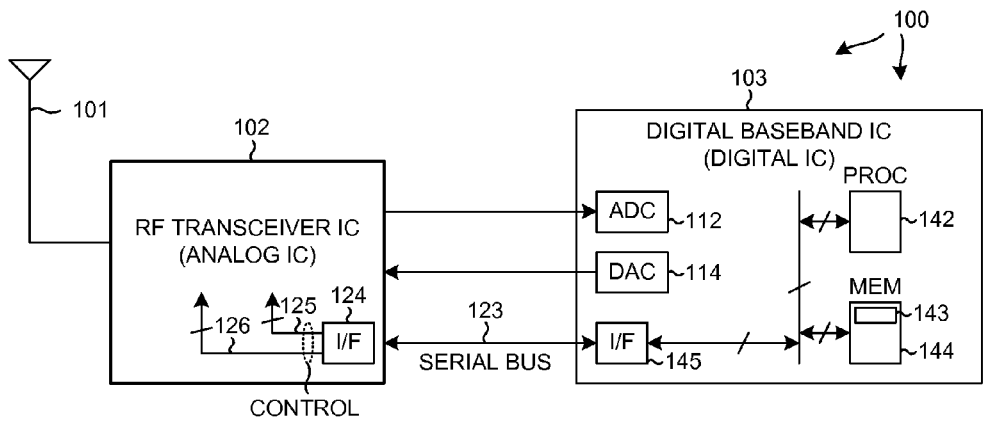
FIG. 1 is a very simplified high level block diagram of one particular type of mobile communication device 100 in accordance with one novel aspect.

FIG. 1 is a very simplified high level block diagram of a mobile communication device 100 in accordance with one novel aspect. In this example, mobile communication device 100 is a cellular telephone. The cellular telephone includes (among several other components not illustrated) an antenna 101 and two integrated circuits 102 and 103. Integrated circuit 103 is called a "digital baseband integrated circuit." Integrated circuit 102 is a Radio Frequency (RF) transceiver integrated circuit. RF transceiver integrated circuit 102 is called a "transceiver" because it includes a transmitter as well as a receiver.

Figure 2:
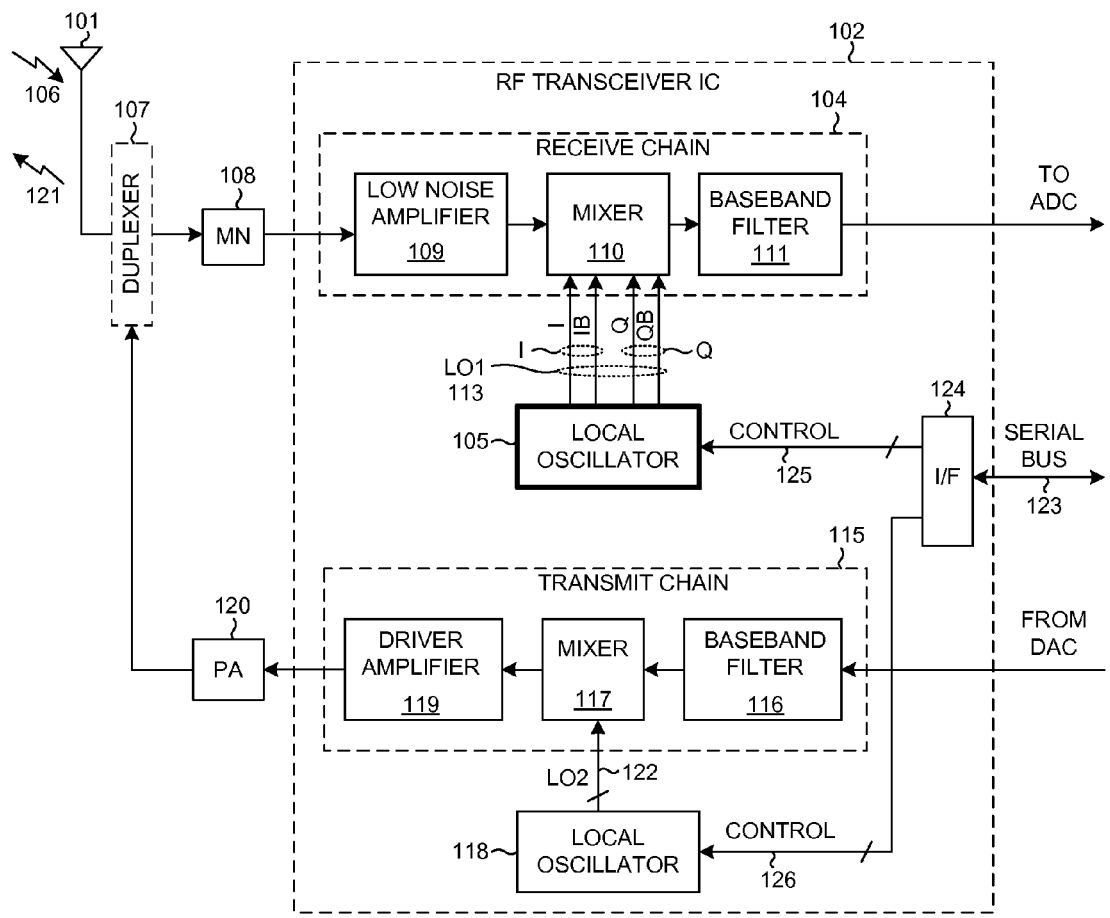
FIG. 2 is a more detailed block diagram of the RF transceiver integrated circuit 102 of FIG. 1.

FIG. 2 is a more detailed block diagram of the RF transceiver integrated circuit 102 of FIG. 1. The receiver includes what is called a "receive chain" 104 as well as a Local Oscillator (LO) 105. When the cellular telephone is receiving, a high frequency RF signal 106 is received on antenna 101. Information from signal 106 passes through duplexer 107, matching network 108, and through the receive chain 104. Signal 106 is amplified by Low Noise Amplifier (LNA) 109 and is down-converted in frequency by mixer 110. The resulting down-converted signal is filtered by baseband filter 111 and is passed to the digital baseband integrated circuit 103 of FIG. 1. An analog-to-digital converter 112 in the digital baseband integrated circuit 103 converts the signal into digital form and the resulting digital information is processed by digital circuitry in the digital baseband integrated circuit 103. The digital baseband integrated circuit 103 tunes the receiver by controlling the frequency of an LO signal (LO1) supplied on local oscillator output 113 to mixer 110.

If the cellular telephone is transmitting, then information to be transmitted is converted into analog form by a Digital-to-Analog Converter (DAC) 114 in the digital baseband integrated circuit 103 and is supplied to a "transmit chain" 115 in the RF transceiver integrated circuit 102. Baseband filter 116 then filters out noise due to the digital-to-analog conversion process. Mixer block 117 under control of Local Oscillator (LO) 118 then up-converts the signal into a high frequency signal. Driver amplifier 119 and an external Power Amplifier (PA) 120 amplify the high frequency signal to drive antenna 101 so that a high frequency RF signal 121 is transmitted from antenna 101. The digital baseband integrated circuit 103 controls the transmitter by controlling the frequency of an LO signal (LO2) supplied on local oscillator output 122 to mixer 117. Digital baseband integrated circuit 103 controls the local oscillators 105 and 118 by sending appropriate control information across a digital serial bus 123, through bus interface 124, and control lines 125 and 126.

Figure 3:
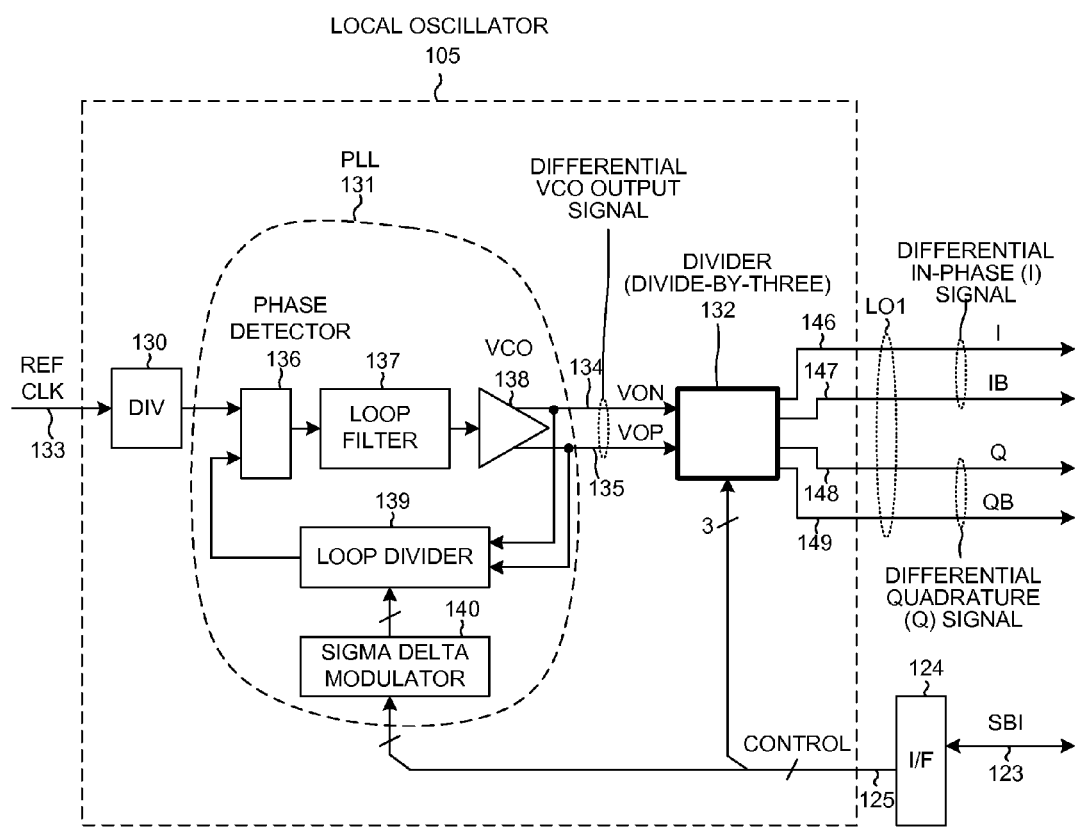
FIG. 3 is a more detailed block diagram of the local oscillator 105 of the receiver in the RF transceiver integrated circuit 102 of FIG. 2.

FIG. 3 is a more detailed diagram of local oscillator 105 of the receiver in the RF transceiver integrated circuit 102 of FIG. 2. Local oscillator 105 includes a divider 130, a Phase-Locked Loop (PLL) 131 and a divide-by-three circuit 132. PLL 131 receives an externally generated reference signal REF CLK on conductor 133 (for example, a 19.2 MHz signal generated by an external crystal oscillator) and generates therefrom a differential PLL output signal VO. The label "VO" used here indicates that the VO signal is the differential VCO output signal. The signal VO includes a signal VON on conductor 134 and a signal VOP on conductor 135. The PLL 131 in this case includes a phase comparator 136, a loop filter 137, a Voltage Controlled Oscillator (VCO) 138, a loop divider 139, and a Sigma-Delta Modulator 140. The VO signal output by VCO 138 is divided down in frequency by a novel divide-by-three circuit 132 to generate local oscillator signal LO1. As explained above, local oscillator signal LO1 includes a differential In-phase (I) signal and a differential Quadrature (Q) signal and are supplied to the mixer 110 of the receiver of FIG. 2. Differential In-phase (I) output signal I involves signal I on conductor 146 and signal IB on conductor 147. Differential Quadrature (Q) output signal involves signal Q on conductor 148 and signal QB on conductor 149. Divide-by-three circuit 132 also receives a multi-bit digital control value supplied from conductors 125. This control value is used by divider 132 as explained in further detail below. The multi-bit digital control signal is determined by a processor 142 (see FIG. 1) in digital baseband integrated circuit 103 by the execution of a set of processor-executable instructions 143 stored in a processor-readable medium 144. Once the digital control value is determined, it is communicated through serial bus interface 145, serial bus 123, serial bus interface 124, and conductors 125 to local oscillator 105.

Figure 4:
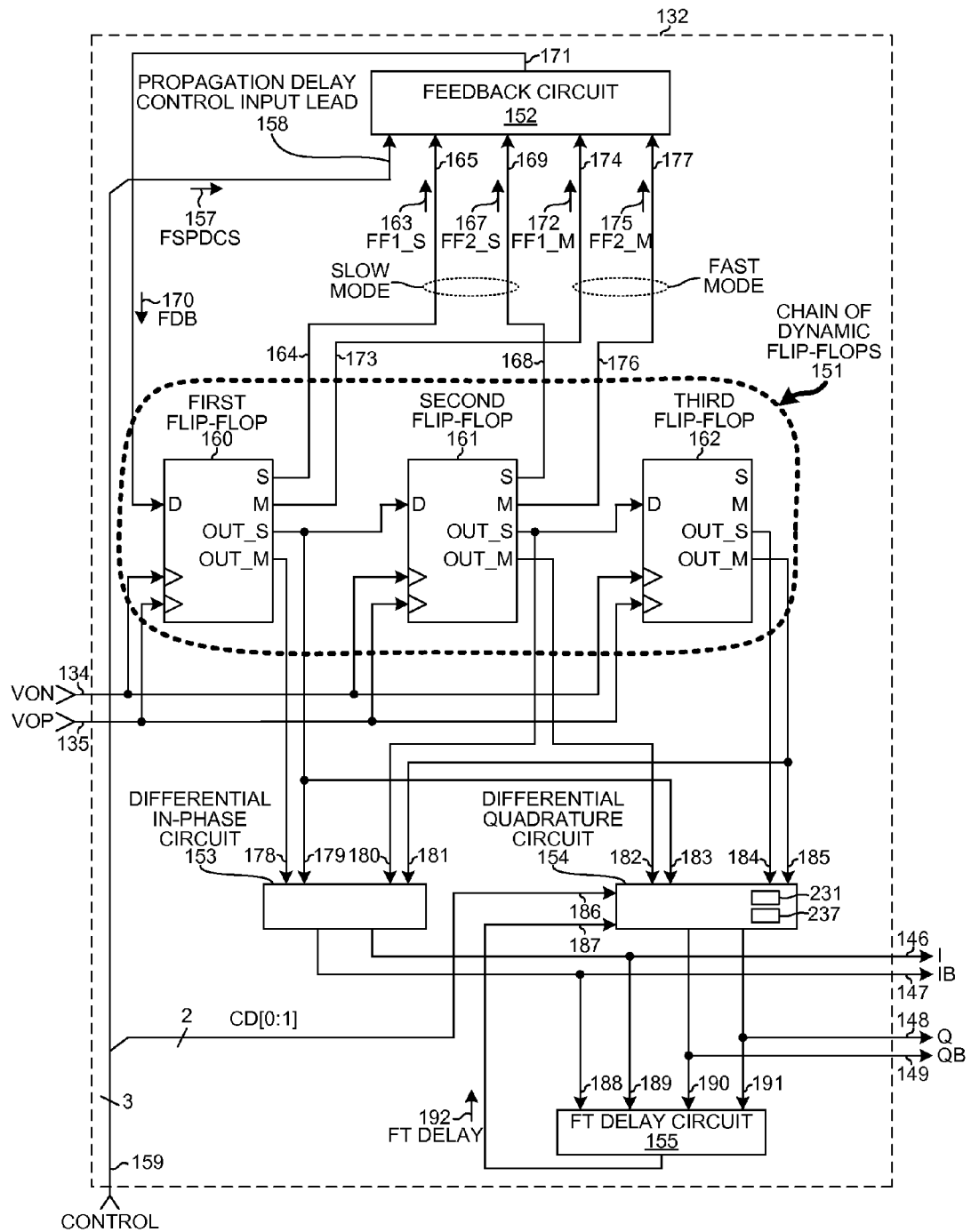
FIG. 4 is a block diagram of the novel divide-by-three circuit 132 of FIG. 3.

FIG. 4 is a detailed block diagram of the novel divide-by-three circuit 132 of FIG. 3.

The divide-by-three circuit 132 includes a chain of dynamic flip-flops 151, feedback circuit 152, differential in-phase circuit 153, differential quadrature circuit 154, and Fine Tune (FT) delay feedback circuit 155. Differential quadrature circuit 154 further includes coarse delay circuits 231 and 237. Divide-by-three circuit 132 receives a signal VON and a signal VOP via conductors 134 and 135, respectively. Divide-by-three circuit 132 additionally receives a multi-bit digital control value from control lines 125 of FIG. 3. The multi-bit digital control value includes a two-bit control signal CD[0:1] and a one-bit Feedback Signal Propagation Delay Control Signal (FSPDCS). Control signal CD[0:1] is supplied onto differential quadrature circuit 154, and FSPDCS is supplied onto propagation delay control input lead 158 of feedback circuit 152. The chain of dynamic flip-flops 151 further comprises a first dynamic flip-flop 160, a second dynamic flip-flop 161, and third dynamic flip-flop 162. Each Signals VON and VOP synchronously clock the three dynamic flip-flops of chain 151 via conductors 134 and 135. A signal path extends through the chain of dynamic flip-flops 151 (not shown in FIG. 4). Divide-by-three circuit 132 generates differential In-phase signals I and IB, and are supplied onto conductors 146 and 147, respectively. Divide-by-three circuit 132 also generates differential Quadrature signals Q and QB, and are supplied onto conductors 148 and 149, respectively. Further details of each component are provided in the descriptions of figures below.

In accordance with one novel aspect, first flip-flop 160, second flip-flop 161, and feedback circuit 152 form two feedback paths. In one feedback path, first flip-flop 160 supplies an FF1_S signal 163 via conductor 164 onto a first input lead 165 of feedback circuit 152, and second flip-flop 161 supplies an FF2_S signal 167 via conductor 168 onto a second input lead 169 of feedback circuit 152. Signal FF1_S 163 is supplied from a node of a slave stage portion (not shown in FIG. 4) of first flip-flop 160, and signal FF2_S 167 is supplied from a node of a slave stage portion (not shown in FIG. 4) of second flip-flop 161. Feedback circuit 152 generates a feedback signal (FDB) 170 determined from FF1_S 163 and FF2_S 167 through combinatorial logic. The output of the combinatorial logic of feedback circuit 152 is supplied onto output lead 171 of feedback circuit 152. FDB 170 is then supplied onto the D input of first flip-flop 160. When this feedback path is activated, the divide-by-three circuit 132 is said to be operating in a "nine-stage feedback" or "slow mode". The signal labels "FF1" and "FF2" used here are abbreviations for "first flip-flop" and "second flip-flop", respectively. Similarly, "FF3" is used below to denote "third flip-flop".

In a second feedback path, first flip-flop 160 supplies a signal FF1_M 172 via conductor 173 onto a third input lead 174 of feedback circuit 152, and second flip-flop 161 supplies a signal FF2_M 175 via conductor 176 onto a fourth input lead 177 of feedback circuit 152. Signal FF1_M 172 is supplied from a node of a master stage portion (not shown in FIG.

4) of first flip-flop 160, and signal FF2_M 175 is supplied from a node of a master stage portion (not shown in FIG. 4) of second flip-flop 161. Feedback circuit 152 generates the FDB signal 170 determined from FF1_M 172 and FF2_M 175 through combinatorial logic. The output of the combinatorial logic of feedback circuit 152 is supplied onto output lead 171 of feedback circuit 152. FDB 170 is then supplied onto the D input of first flip-flop 160. When this feedback path is activated, the divide-by-three circuit 132 is said to be operating in a "seven-stage feedback" or "fast mode". FSPDCS signal 157 received onto the propagation delay control input lead 158 of feedback circuit 152 determines whether divide-by-three circuit 132 operates in slow mode or fast mode.

In accordance with another novel aspect, locations along the chain of dynamic flip-flops 151 provide input signals to the differential in-phase circuit 153 and the differential quadrature circuit 154. Differential in-phase circuit 153 has a first input lead 178 coupled to an OUT_M output lead of first flip-flop 160, a second input lead 179 coupled to an OUT_S output lead of first flip-flop 160, a third input lead 180 coupled to an OUT_S output lead of second flip-flop 161, and a fourth input lead 181 coupled to an OUT_M output lead of third flip-flop 162. Differential in-phase circuit 153 receives four input signals onto input leads 178, 179, 180 and 181 from locations along the signal path (not shown in FIG. 4) extending through the chain of flip-flops 151. Combinatorial logic of differential in-phase circuit 153 receives the four input signals and generates differential In-phase signals I and IB, and supplies the signals I and IB onto conductors 146 and 147, respectively.

Differential quadrature circuit 154 has a first input lead 182 coupled to an OUT_M output lead of the second flip-flop 161, a second input lead 183 coupled to an OUT_S output lead of first flip-flop 160, a third input lead 184 coupled to an OUT_S output lead of third flip-flop 162, and a fourth input lead 185 coupled to an OUT_M output lead of third flip-flop 162. Differential quadrature circuit 154 additionally receives an FT delay signal 192 onto Fine Tune (FT) control input lead 187 generated by Fine Tune (FT) delay feedback circuit 155, and also receives a 2-bit control signal CD[0:1] onto input lead 186 via conductors 159. Combinatorial logic of differential quadrature circuit 154 then receives the four input signals from locations along the signal path extending through chain 151, FT delay signal 192, and 2-bit control signal CD[0:1] and generates differential quadrature signals Q and QB, which are then supplied onto conductors 148 and 149, respectively.

Divide-by-three circuit 132 generates differential In-phase signals I and IB, and generates differential Quadrature signals Q and QB. In one example, differential signal I generated by differential in-phase circuit 153 is approximately ninety degrees out of phase with respect to differential signal Q, and differential signal IB is approximately ninety degrees out of phase with respect to differential signal QB. In another example, combinatorial logic of the coarse delay circuits 231 and 237 of differential quadrature circuit 154 introduces an approximately thirty-degree delay such that signal I generated by differential in-phase circuit 153 is ninety degrees out of phase with respect to differential signal Q, and differential signal IB is ninety degrees out of phase with respect to differential signal QB. Further details of divide-by-three circuit 132 are described below.

Figure 5:
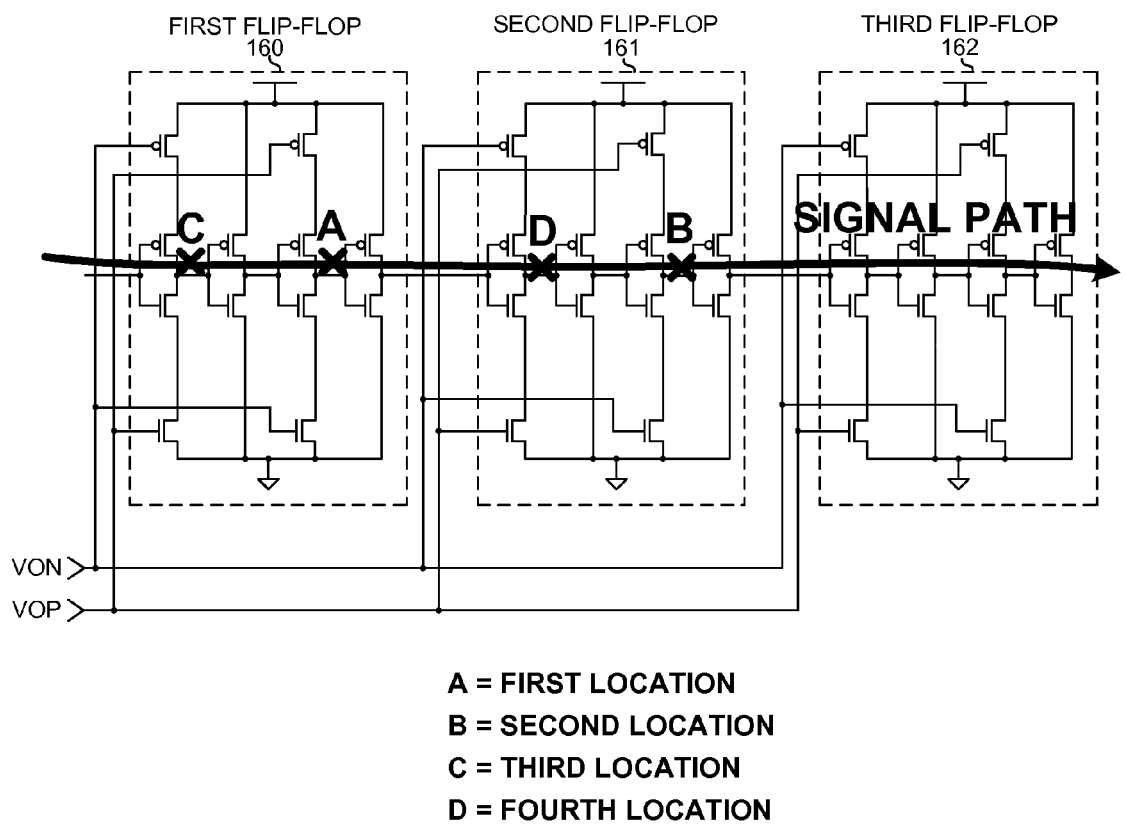
FIG. 5 is a circuit diagram of the chain of dynamic flip-flops 151 of FIG. 4 showing a signal path extending through the chain of flip-flops.

FIG. 5 is a circuit diagram of the chain of dynamic flip-flops of divide-by-three circuit 132 of FIG. 4 showing a signal path extending through the chain. In one example, divide-by-three circuit 132 operates in a first mode such that the first input lead 165 of the feedback circuit of combinatorial logic 152 of FIG. 4 is coupled to a first location (A) along the signal path, and the second input lead 169 of the feedback circuit of combinatorial logic 152 is coupled to a second location (B) along the signal path. The first location (A) is located in a slave stage of the first flip-flop 160, and more particularly is at an output node of the dynamic portion of the slave stage of the first flip-flop 160. The second location (B) is located in a slave stage of the second flip-flop 161, and more particularly is an output node of the dynamic portion of the slave stage of the second flip-flop 161. In another example, divide-by-three circuit 132 operates in a second mode, such that the third input lead 174 of the feedback circuit of combinatorial logic 152 is coupled to a third location (C) along the signal path, and the fourth input lead 177 of the feedback circuit of combinatorial logic 152 is coupled to a fourth location (D) along the signal path. The third location (C) is located in a master stage of the first flip-flop 160, and more particularly at an output node of the dynamic portion of the master stage of the first flip-flop 160. The fourth location (D) is located in a master stage of the second flip-flop 161, and more particularly at an output node of the dynamic portion of the master stage of the second flip-flop 161.

Figure 6:
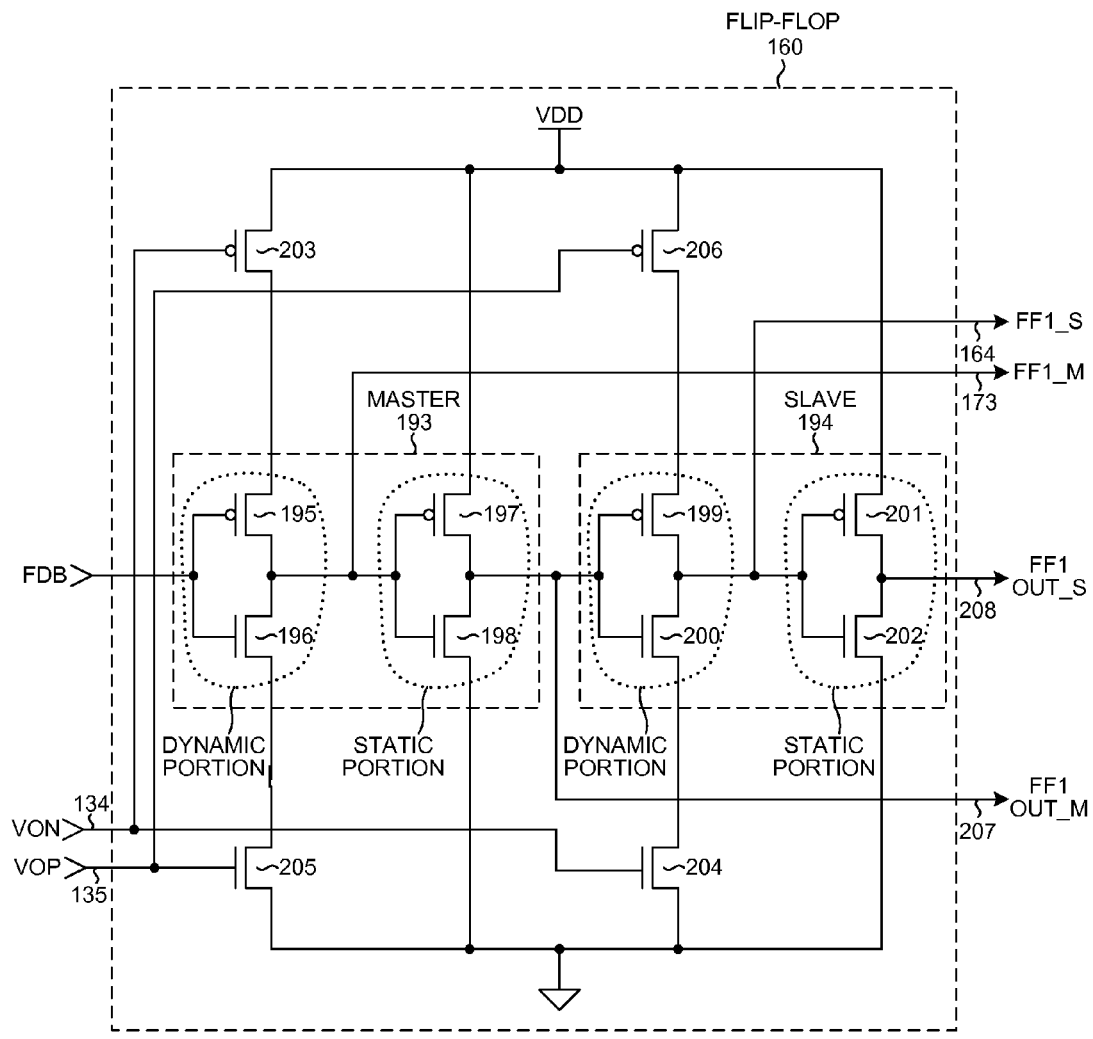
FIG. 6 is a circuit diagram of the first dynamic flip-flop 160 of FIG. 4.

FIG. 6 is a circuit diagram of one of the dynamic flip-flops 160 of the flip-flop chain 151 of FIG. 4. First-flop 160 includes a master portion 193 and a slave portion 194. Master portion 193 includes two Complementary Metal-Oxide-Semiconductor (CMOS) inverters in parallel. The first inverter includes transistors 195 and 196, and forms the dynamic portion of the master. The second inverter includes transistors 197 and 198, and forms the static portion of the master. Similarly, slave portion 194 includes two CMOS inverters in parallel. The first inverter includes transistors 199 and 200, and forms the dynamic portion of the slave. The second inverter includes transistors 201 and 202, and forms the static portion of the slave.

First flip-flop 160 receives an input signal VON and VOP via conductors 134 and 135, respectively. Signal VON is supplied onto a gate of transistor 203 and a gate of transistor 204, and signal VOP is supplied onto a gate of transistor 205, and a gate of transistor 206. When dynamic portion of master 193 is active, dynamic portion of slave 194 is inactive. First flip-flop 160 supplies an output signal FF1 OUT_M from master portion 193 onto conductor 207 and supplies an output signal FF1 OUT_S from slave portion 194 onto conductor 208. First flip-flop 160 also supplies an output signal FF1_S from a node of slave portion 194, and supplies an output signal FF1_M from a node of master portion 193. When divide-by-three circuit 132 is operating with nine-stage feedback (slow mode), signal FDB 170 generated by feedback circuit 152 of FIG. 4 is determined in part from output signal FF1_S from slave portion 194. Alternatively, when divide-by-three circuit 132 is operating with seven-stage feedback (fast mode), signal FDB 170 generated by feedback circuit 152 is determined in part from output signal FF1_M from master portion 193.

Figure 7:
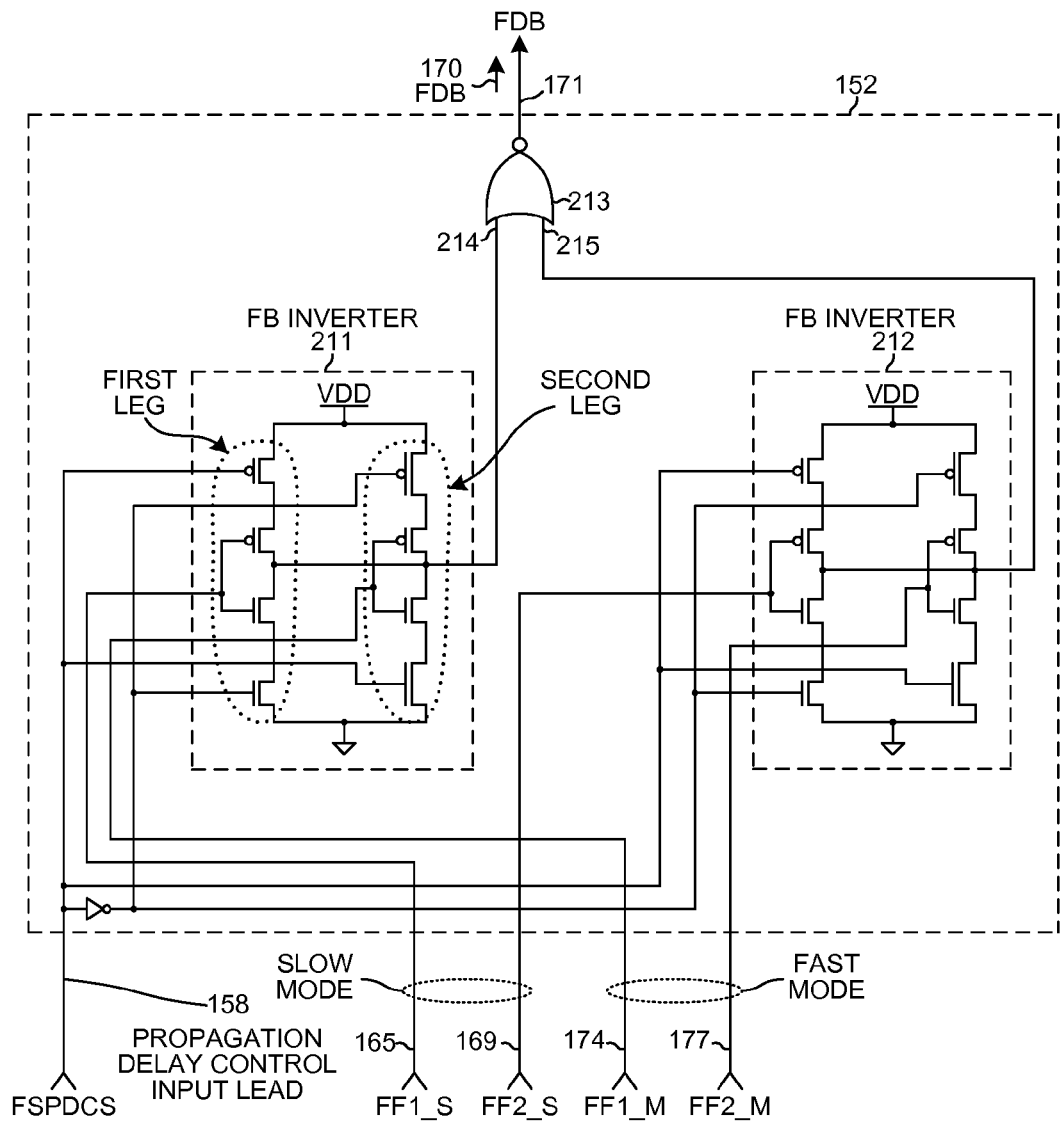
FIG. 7 is a circuit diagram of the feedback circuit 152 of FIG. 4.

FIG. 7 is a circuit diagram of feedback circuit 152 of FIG. 4. Feedback circuit 152 of combinatorial logic includes a first Feedback (FB) inverter 211, a second FB inverter 212, and digital logic NOR gate 213. FB inverters 211 and 212 further include two CMOS inverters in parallel, which form a first leg and a second leg. Feedback circuit 152 receives the FSPDCS input signal onto propagation delay control input lead 158.

If FSPDCS has a digital logic low value ("0"), then divide-by-three circuit 132 is operating with the nine-stage feedback (in slow mode) and the first legs of the FB inverters are enabled and the second legs of the FB inverters are disabled. The enabled first leg of FB inverter 211 inverts the signal FF1_S from input lead 165 and supplies an inverted version of the signal onto first input 214 of NOR gate 213. The enabled first leg of FB inverter 212 inverts the signal FF2_S from input lead 169 and supplies an inverted version of the signal onto a second input lead 215 of NOR gate 213. NOR gate 213 provides an output signal FDB 170 onto output lead 171 of feedback circuit 152. Signal FDB 170 is then supplied onto a D input of first flip-flop 160.

Alternatively, if FSPDCS has a digital logic high value ("1"), then divide-by-three circuit 132 is operating with the seven-stage feedback (in fast mode) and the second legs of the FB inverters are enabled (whereas the first legs are disabled). The enabled second leg of FB inverter 211 inverts the signal FF1_M from input lead 174 and supplies an inverted version of the signal onto first input 214 of NOR gate 213. Note that the enable transistors of the second leg inverter are larger than the enable transistors of the first leg inverter. Consequently the propagation delay through the second leg is smaller than the propagation delay through the first leg. The enabled second leg of FB inverter 212 inverts the signal FF2_M from input lead 177 and supplies an inverted version of the signal onto the second input lead 215 of NOR gate 213. Again, the enable transistors of the second leg inverter are larger than the enable transistors of the first leg inverter and the propagation delay through the second leg is smaller than propagation delay through the first leg.

Figure 8:
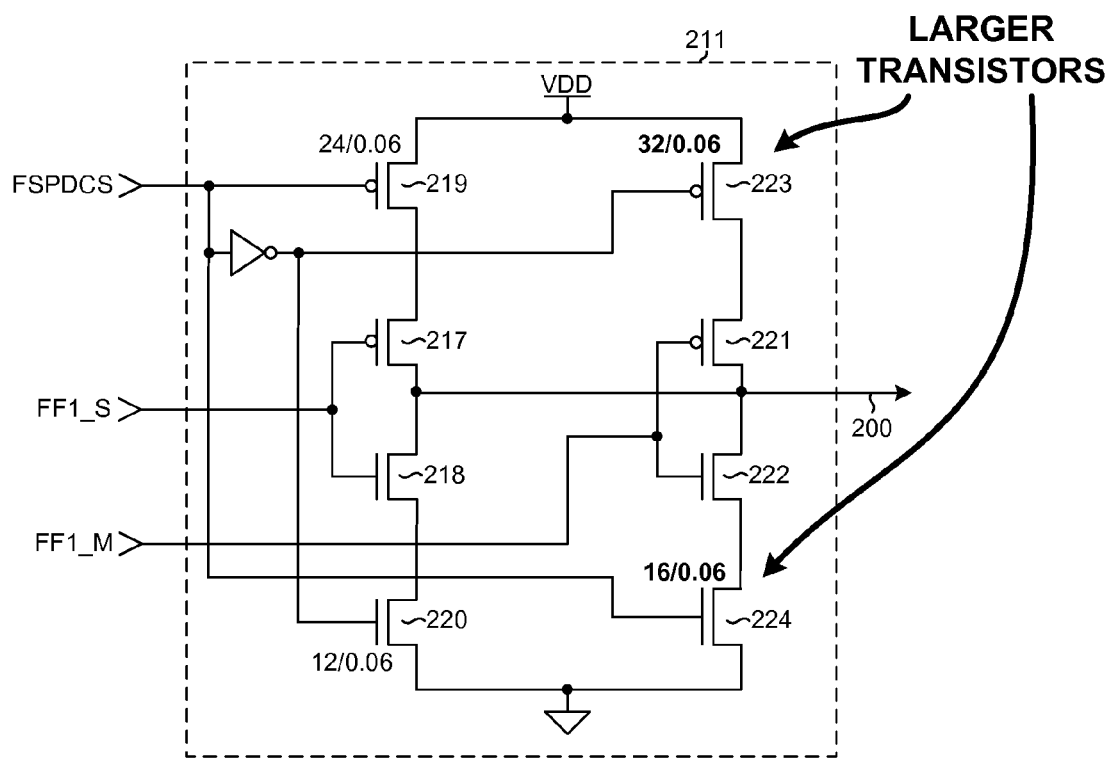
FIG. 8 is a circuit diagram of FB inverter 211 of feedback circuit 152 of FIG. 7.

FIG. 8 is a more detailed circuit diagram of FB inverter 211 of feedback circuit 152 of FIG. 7. FB inverter 212 is of similar construction. Transistors 217-220 form the first leg inverter and transistors 221-224 form the second leg inverter. The enable transistors 223 and 224 of the second leg inverter are larger than are the enable transistors 219 and 220 of the first leg inverter.

Figure 9:
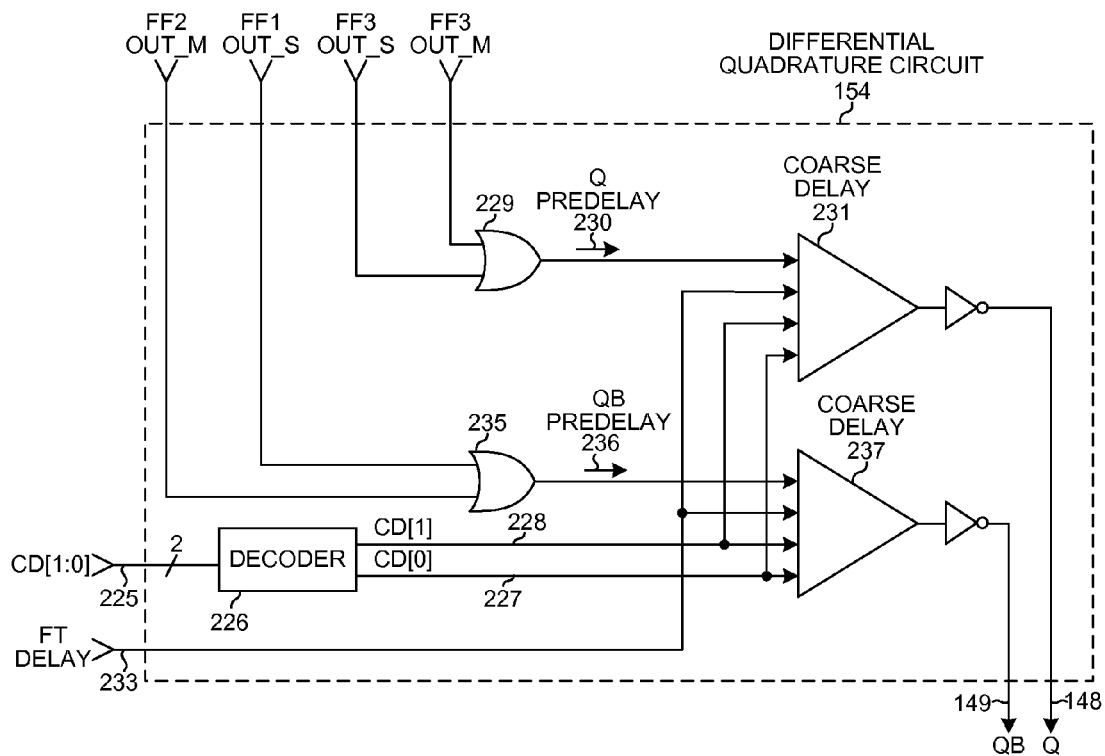
FIG. 9 is a circuit diagram of the differential quadrature circuit 154 of divide-by-three circuit 132 of FIG. 4.

FIG. 9 is a circuit diagram of the differential quadrature circuit of combinatorial logic 154 of FIG. 4. OR gate 229 generates a signal (denoted signal Q PREDELAY 230) that is approximately sixty degrees out of phase with respect to In-Phase signal I on conductor 146 (generated by differential in-phase circuit 153 of FIG. 11) and the signal Q PREDELAY 230 is then delayed an appropriate amount by coarse delay circuit 231 to generate the quadrature signal Q on conductor and output lead 148. Similarly, OR gate 235 generates a signal (denoted signal QB PREDELAY 236) that is approximately sixty degrees out of phase with respect to In-Phase signal IB on conductor 147 (generated by differential in-phase circuit 153 of FIG. 11) and the signal QB PREDELAY 236 is then delayed an appropriate amount by coarse delay circuit 237 to generate the quadrature signal QB on conductor and output lead 149. The amount of delay caused by coarse delay circuits 231 and 237 is determined by signal FT delay 192 supplied via conductor 233 and a multi-bit control signal CD[0:1] supplied via conductors 225. Decoder 226 decodes multi-bit control signal CD[0:1] and decoder 226 supplies a first bit CD[0] and a second bit CD[1] onto coarse delay circuits 231 and 237 via conductors 227 and 228, respectively.

Figure 10:
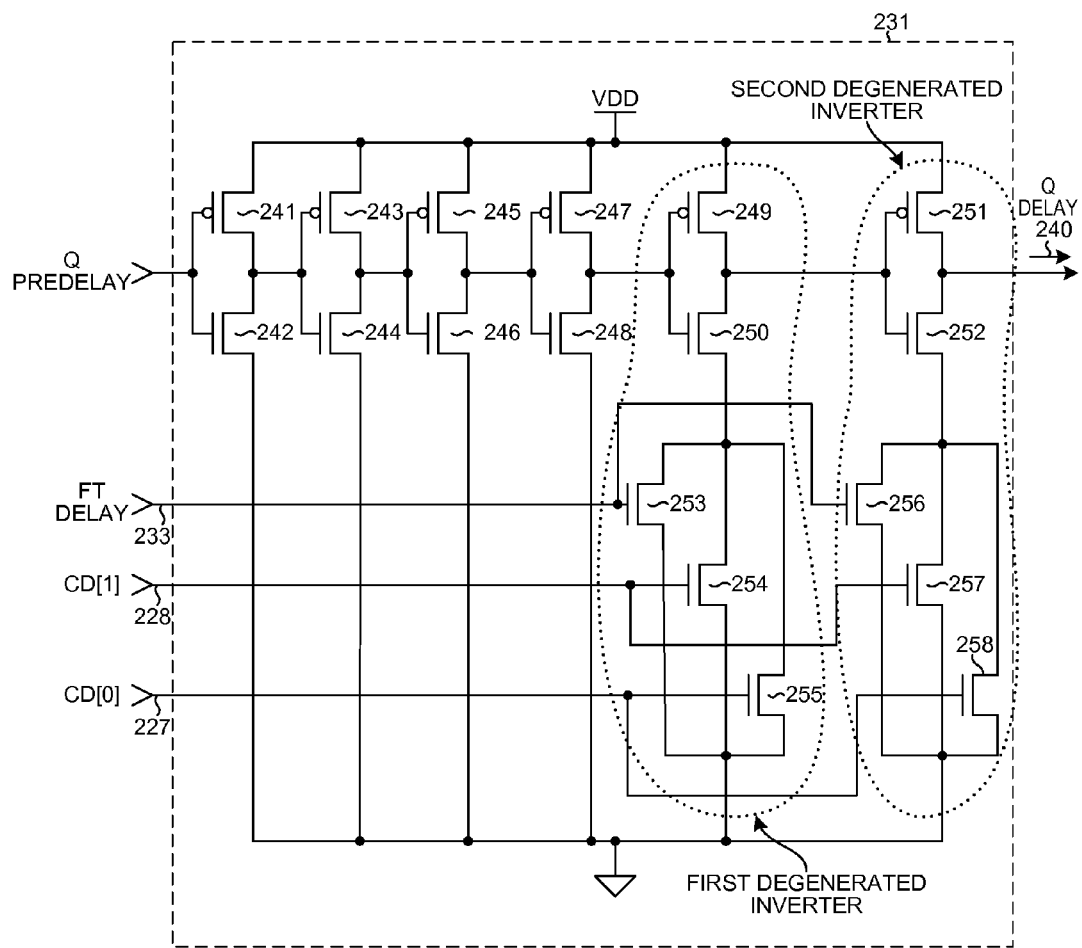
FIG. 10 is a circuit diagram of coarse delay circuit 231 of differential quadrature circuit 154 of FIG. 9.

FIG. 10 is a detailed circuit diagram of coarse delay circuit 231 of differential quadrature circuit 154 of FIG. 9. Coarse delay circuit 237 is of similar construction. In one example, coarse delay circuit 231 of is a circuit of combinatorial logic and includes a chain of CMOS inverters. The chain of CMOS inverters delays input signal Q PREDELAY by the appropriate amount. Coarse delay circuit of combinatorial logic 231 includes a chain of four inverters (transistors 241-248) and two degenerated inverters (transistors 249-258). Signal FT delay 192, signal CD[1], and signal CD[0] control the propagation delay of signal Q PREDELAY through the two degenerated inverters. The signal output by the second degenerated inverter involving transistors 251 and 252 is signal Q DELAY 240.

Figure 11:
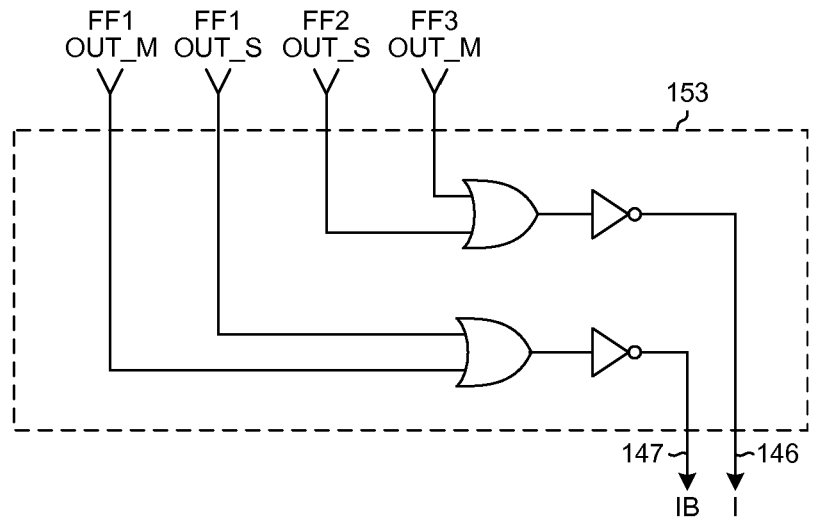
FIG. 11 is a circuit diagram of the differential in-phase circuit 153 of divide-by-three circuit 132 of FIG. 4.

FIG. 11 is a circuit diagram of the differential in-phase circuit 153 of FIG. 4. In one example, differential in-phase circuit 153 is a circuit of combinatorial logic. Differential in-phase circuit of combinatorial logic 153 generates and supplies in-phase signal I onto conductor 146 and in-phase signal IB onto conductor 147.

Figure 12:
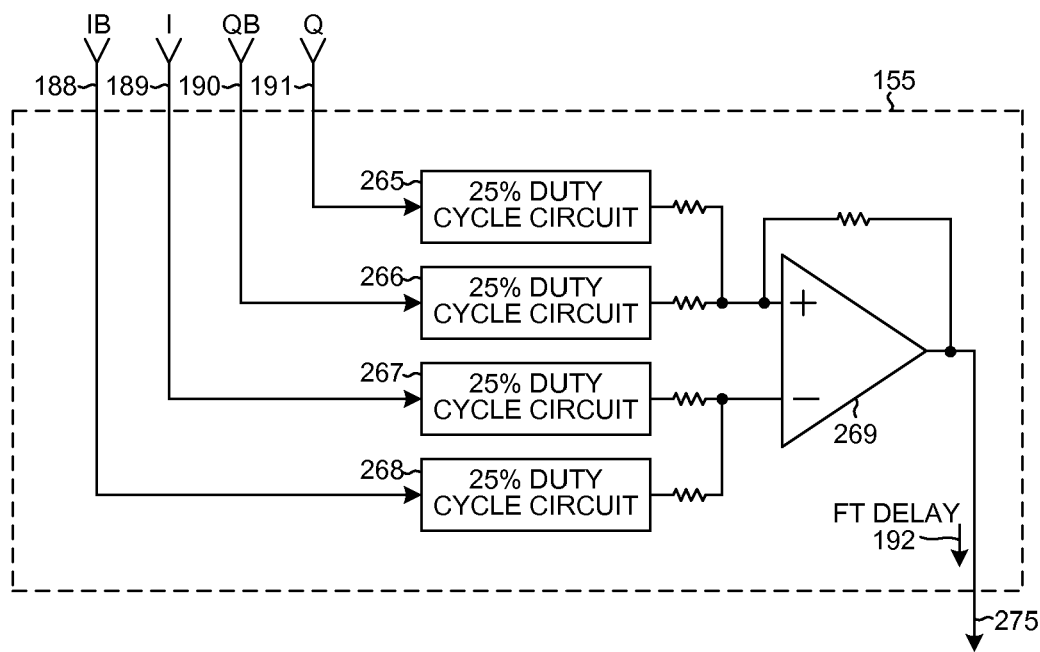
FIG. 12 is a circuit diagram of the Fine Tune (FT) delay circuit 155 of FIG. 4.

FIG. 12 is a detailed circuit diagram of the Fine Tune (FT) delay feedback circuit 155 of FIG. 4. FT delay feedback circuit 155 generates the signal FT delay 192 supplied to coarse delay circuits 231 and 237 (see FIG. 9) affecting the propagation delay of quadrature signals Q and QB. Signal FT delay 192 provides fine adjustment of the propagation delays of quadrature signals Q and QB such that they are closer to quadrature relation with in-phase signals I and IB. FT delay feedback circuit 155 includes four twenty-five percent duty cycle circuits 265-268 and a comparator 269. FT delay feedback circuit 155 receives signal IB onto a first input lead 188, signal I onto a second input lead 189, signal QB onto a third input lead 190, and signal Q onto a fourth input lead 191. Each of these four signals is received onto a corresponding twenty-five percent duty cycle circuit, which outputs a twenty-five percent duty cycle version of the inputted signal. In-phase signals I and IB are added at the inverting input of comparator 269, quadrature signals Q and QB are added at the non-inverting input of comparator 269. Comparator 269 outputs signal FT Delay 192 onto output lead 275. The magnitude of FT Delay 192 is related to the phase difference between the Q and I signals.

Figure 13:
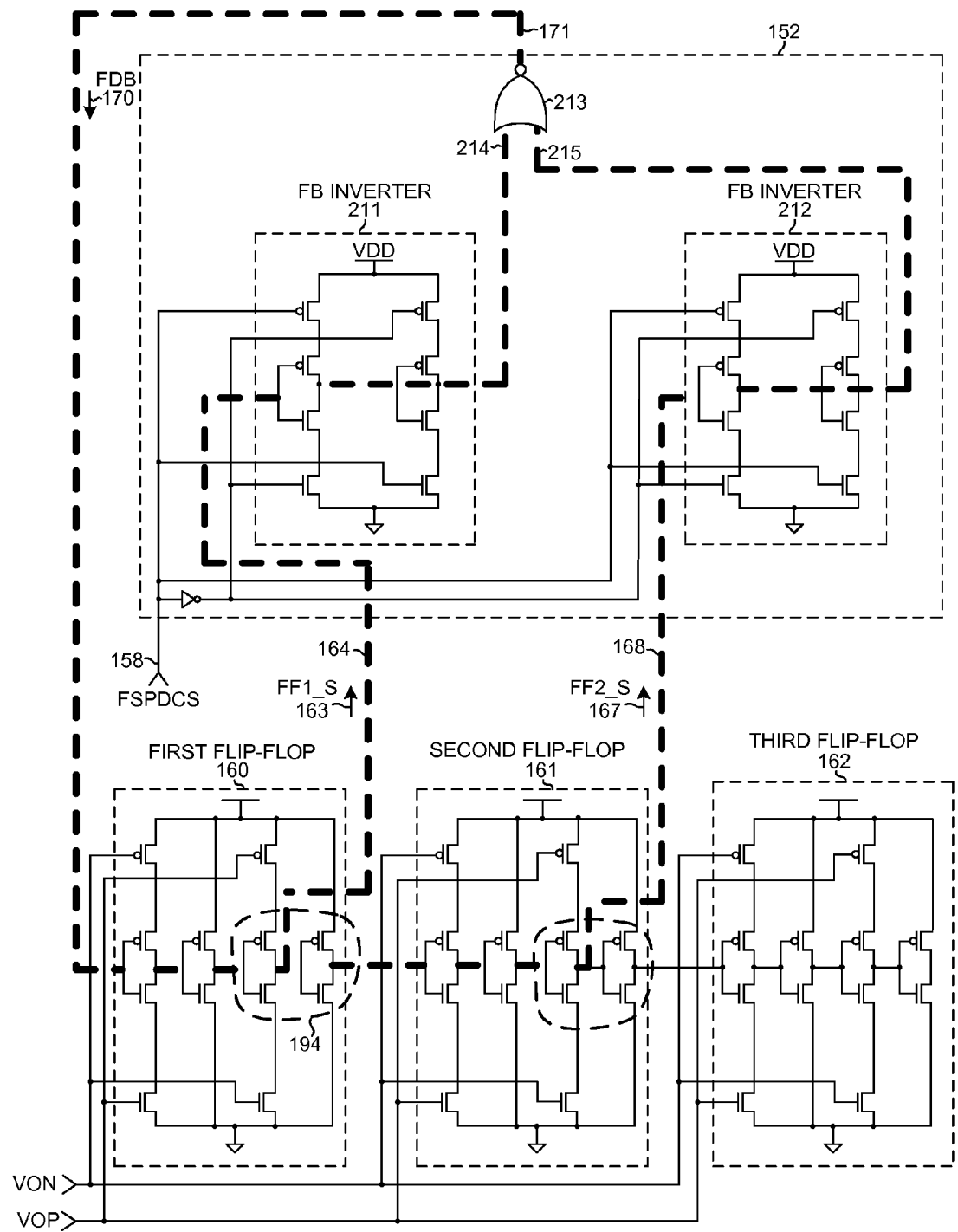
FIG. 13 is a simplified circuit diagram illustrating the signal path involved in the nine-stage feedback (or slow mode) when divide-by-three circuit 132 is operating in steady-state.

FIG. 13 is a simplified circuit diagram illustrating the signal path involved in the nine-stage feedback (or slow mode) when divide-by-three circuit 132 is operating in steady-state. The signal feedback path is shown in dashed and bolded lines. In slow mode, signal FF1_S 163 from flip-flop 160 is supplied via conductor 164 to the input of the first leg inverter of FB inverter 211. The inverter of the first leg of FB inverter 211 inverts FF1_S and supplies the inverted result onto the first input 214 of NOR gate 213. Signal FF2_S 167 from flip-flop 161 is supplied via conductor 168 to the input of the first leg inverter of FB inverter 212. The inverter of the first leg of FB inverter 212 inverts FF2_S and supplies the inverted result onto the second input 215 of NOR gate 213. NOR gate 213 drives the feedback signal FDB 170 onto the D input of first flop-flop 160.

Figure 14:
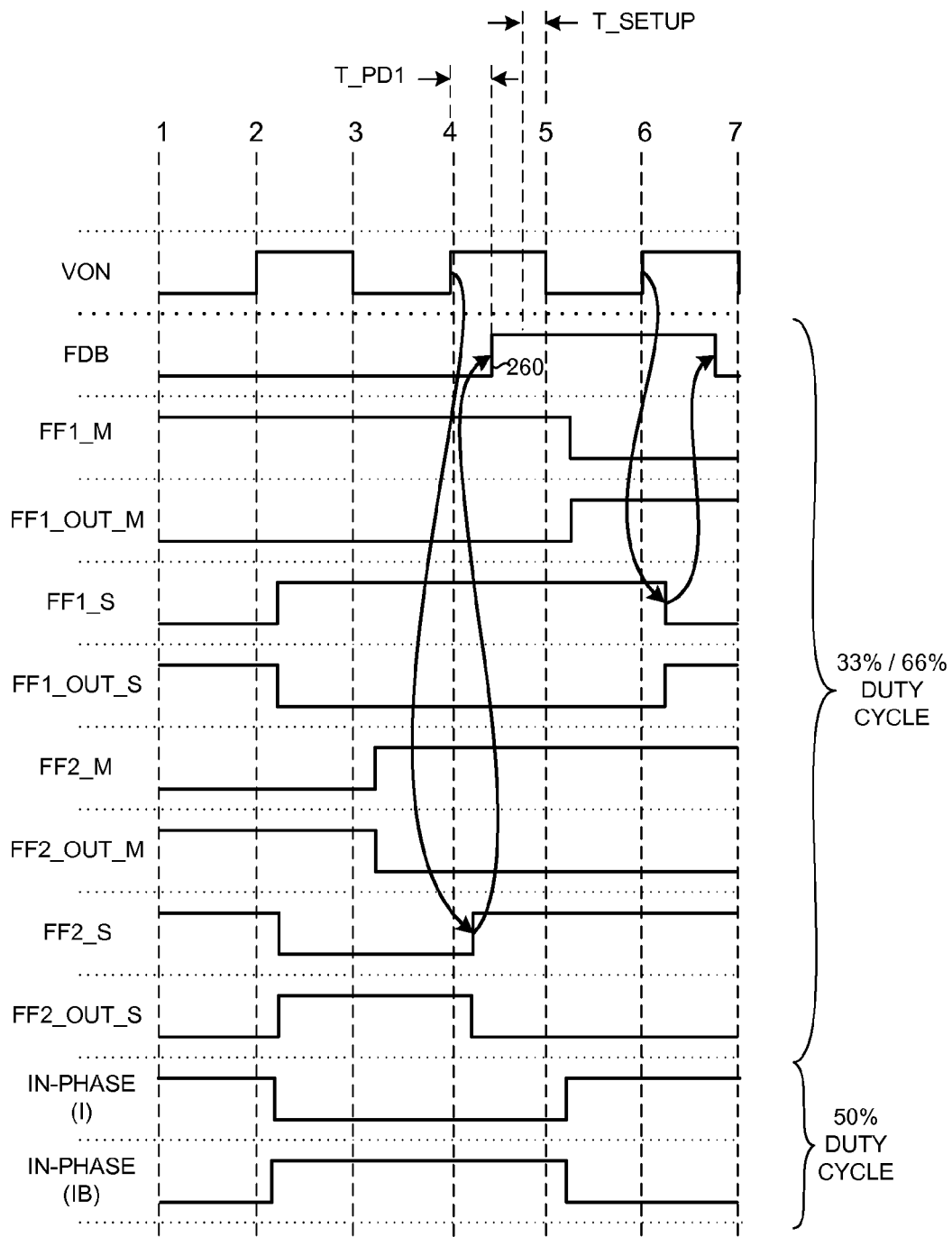
FIG. 14 is a waveform diagram illustrating operation of divide-by-three circuit 132 of FIG. 4 during steady-state in slow mode operation at 1.7 GHz.
Figure 15:
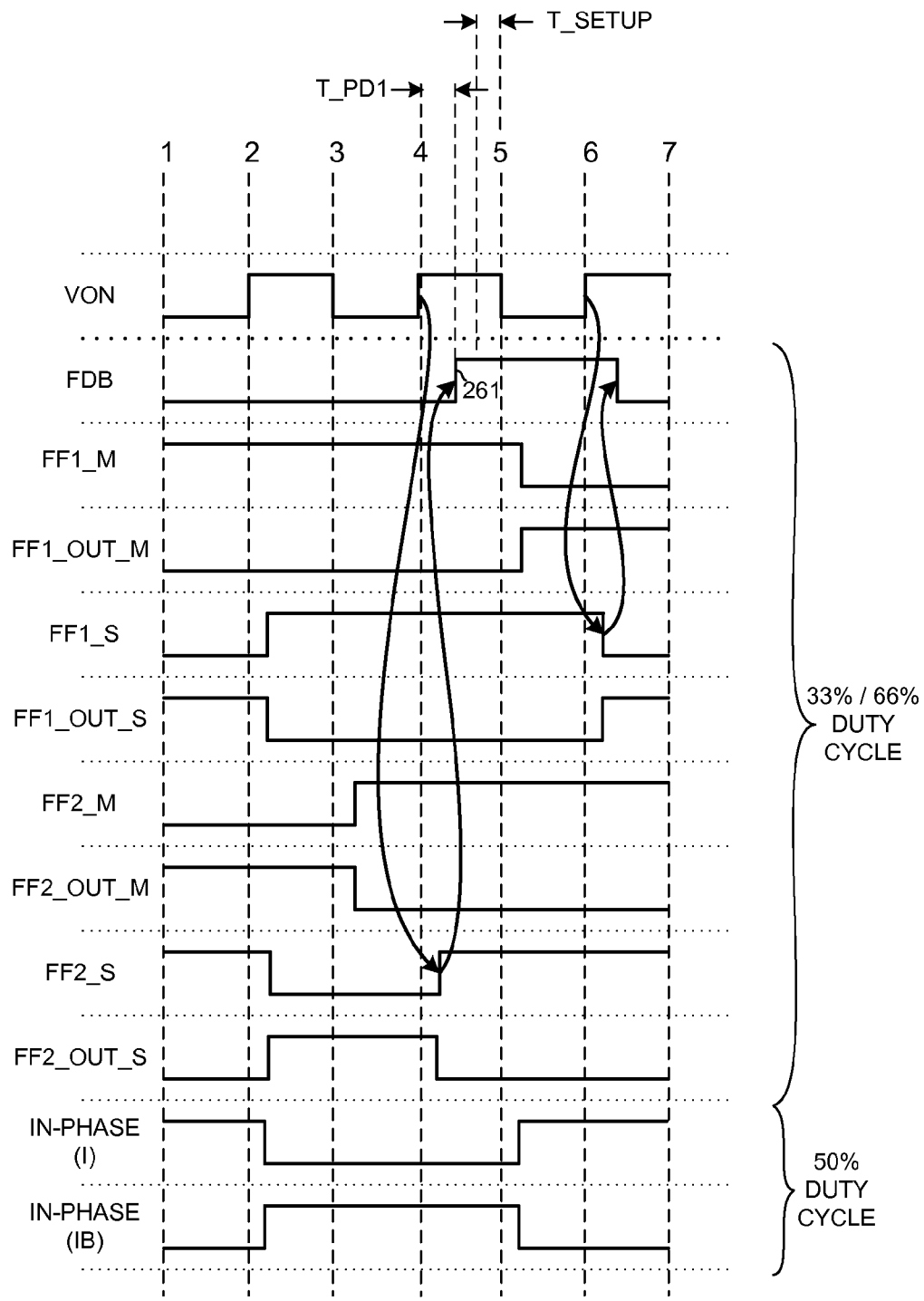
FIG. 15 is a waveform diagram illustrating operation of divide-by-three circuit 132 of FIG. 4 during steady-state in slow mode operation at 2.0 GHz.

FIGS. 14 and 15 are waveform diagrams illustrating the operation of divide-by-three circuit 132 of FIG. 4 during steady-state in slow mode operation at 1.7 GHz and 2.0 GHz. Signal FDB 170 (generated by feedback circuit 152) transitions to a digital logic high value after a low-to-high transition of FF2_S (on S output lead of second flip-flop 161). T_PD1 in FIG. 14 represents a propagation delay from a rising transition of signal VON to the corresponding transition 260 of signal FDB 170 supplied on output lead 171 of feedback circuit 152. T_SETUP indicates the setup time of first flip-flop 160. FIG. 15 indicates that as the frequency of VON is increased to 2.0 GHz, the low-to-high transition 261 of signal FDB 170 approaches the setup time T_SETUP of first flip-flop 160. If transition 261 were to occur later than T_SETUP before the falling edge of VON, then the setup time of first flip-flop 160 would be violated. Rather than violating T_SETUP as the clock frequency of VON increases, the mode of the divide-by-three circuit 132 switches from the nine-stage mode to the seven-stage mode.

Figure 16:
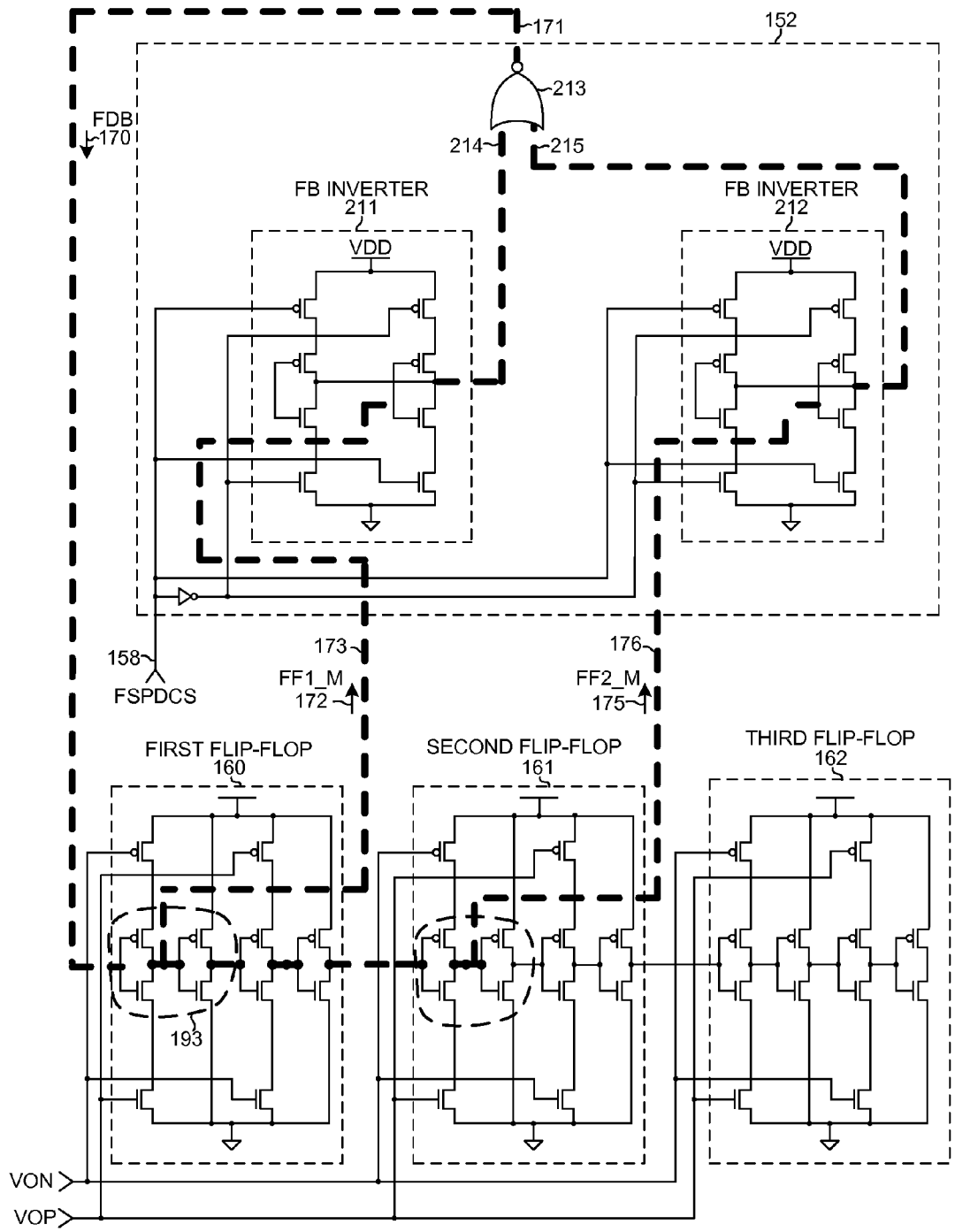
FIG. 16 is a simplified circuit diagram illustrating the signal path involved in the seven-stage feedback (or fast mode) when divide-by-three circuit 132 is operating in steady-state.

FIG. 16 is a simplified circuit diagram illustrating operation in the seven-stage feedback (or fast mode) when divideby-three circuit 132 is operating in steady-state. The signal feedback path is shown in dashed and bolded lines. In fast mode, signal FF1_M 172 and FF2_M 175 propagate through the second legs of FB inverters 211 and 212, respectively. Since the second legs have smaller propagation delays as compared to the propagation delays of first legs, T_SETUP of first flip-flop 160 is not violated as the clock frequency of VON increases.

Figure 17:
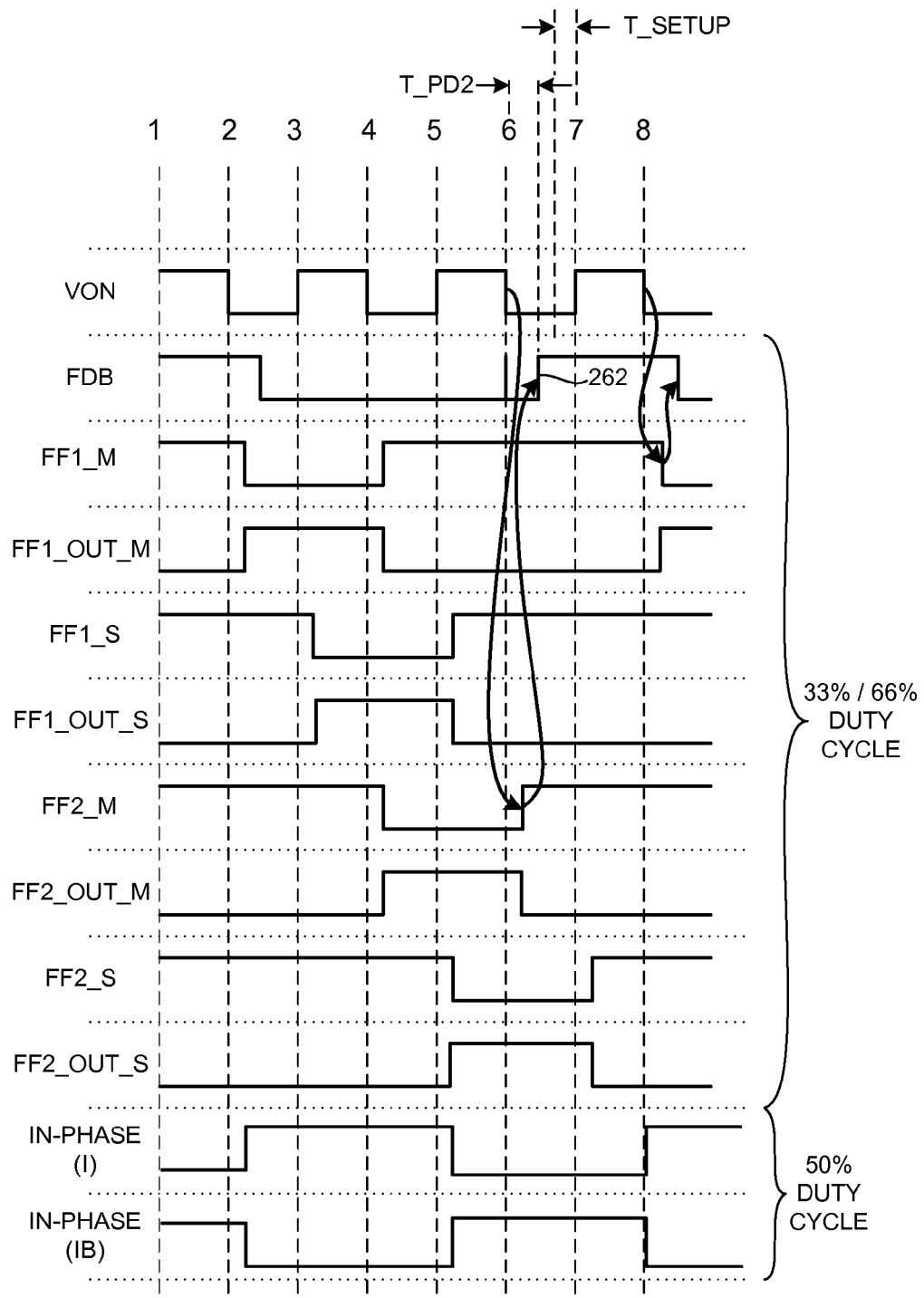
FIG. 17 is a waveform diagram illustrating operation of divide-by-three circuit 132 of FIG. 4 during steady-state in fast mode operation at 2.5 GHz.

FIG. 17 is a waveform diagram illustrating operation of divide-by-three circuit 132 of FIG. 4 during steady-state in fast mode operation at 2.5 GHz. Delay T_PD2 is the signal propagation delay from the falling edge of VON to the rising transition 262 of FDB. Despite increasing the frequency of VON up to 2.5 GHz, the setup time T_SETUP to the rising edge of VON is not violated. The higher speed seven-stage feedback of FIG. 17 cannot be used at lower frequencies down to 1.7 GHz without violating the hold time of first flip-flop 160. For this reason, the nine-stage feedback mode is provided for lower clock frequency operation. Divide-by-three circuit 132 is therefore capable of operating across multiple frequency ranges. For VON frequencies in the range from 1.7 GHz to 2.0 GHz, nine-stage feedback is enabled (FSPDCS=0). For VON frequencies in the range from 2.0 GHz to 2.5 GHz, seven-stage feedback is enabled (FSPDCS=1).

FIGS. 14, 15 and 17 also illustrate another novel aspect of divider 132. The input signals to the differential in-phase circuit 153 of purely combinatorial logic have an approximately thirty-three percent duty cycle or sixty-six percent duty cycle. The differential in-phase circuit 153 converts these signals into I and IB signals that have approximately fifty percent duty cycles. Similarly, differential quadrature circuit 154 of purely combinatorial logic converts approximately thirty-three percent duty cycle or sixty-six percent duty cycle signals into Q and QB signals (not illustrated) that have approximately fifty percent duty cycles.

Figure 18:
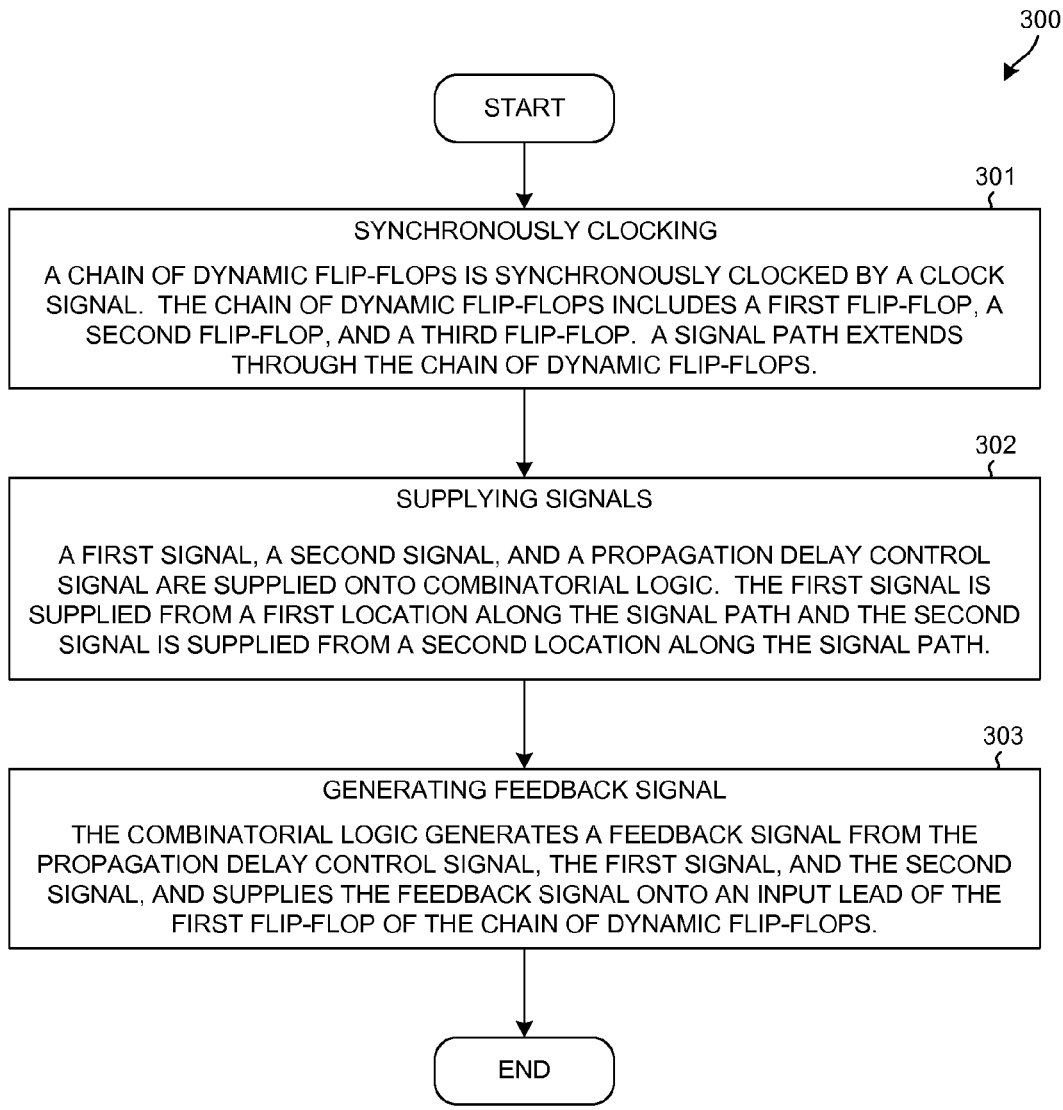
FIG. 18 is a simplified flowchart of a method in accordance with one novel aspect.

FIG. 18 is a diagram of a flowchart in accordance with one novel aspect. In a first step (step 301), a clock signal is received onto a divide-by-three circuit and synchronously clocks a chain of dynamic flip-flops. For example, in FIG. 4 signals VON and VOP received onto divide-by-three circuit 132 synchronously clock a first flip-flop 160, a second flip-flop 161, and a third flip-flop 162 via conductors 134 and 135, respectively. The first step (step 301) further involves a signal path extending through the chain of dynamic flip-flops. For example, in FIG. 5 a signal path extends through first flip-flop 160, second flip-flop 161, and third flip-flop 162.

In a second step (step 302), a first signal, a second signal and a propagation delay control signal are supplied onto combinatorial logic. The first and second signals are supplied from a first location and a second location along the signal path. For example, in FIG. 4, signal FF1_S 163 is supplied onto a first input lead 165 of a feedback circuit of combinatorial logic 152, and signal FF2_S 167 is supplied onto a second input lead 169 of combinatorial logic 152. Propagation delay control signal FSPDCS 157 is supplied onto a propagation delay control input lead 158 of combinatorial logic 152.

In a third step (step 303), the combinatorial logic generates a feedback signal determined by the first signal, the second signal, and the propagation delay control signal. The combinatorial logic supplies the generated feedback signal onto an input lead of the first flip-flop of the chain of dynamic flip-flops. For example, combinatorial logic 152 in FIG. 4 generates a feedback signal FDB 170. Feedback signal FDB 170 is supplied onto the D input of first flip-flop 160 of the chain of dynamic flip-flops 151.

The novel differential divide-by-three circuit has multiple advantages. First, designed in a fully differential fashion (rather than two inverted single-ended circuits), the divide-by-three circuit 132 has good power-supply rejection and good isolation between the receive local oscillator 105 and transmit signal path of FIG. 2, and enables a good signal reception and signal-to-noise ratio. By using the disclosed divider architecture realized in a 90 nm CMOS process, the clock frequency can be increased by 1.5 GHz as compared to a conventional divider architecture. Second, by creating a dual feedback path (seven-stage and nine-stage dual feedback paths), the divider operating frequency range (i.e., the highest frequency of the input signal that can be divided by three) is extended. The divider functionality is improved by this invention across different process corners, supply voltages, and temperatures. Third, the phase of the quadrature signals generated is controlled by another feedback system (the fine tune delay circuit 155) that corrects the phase quadrature across different signal frequencies, process corners, supply voltages, and temperatures. In addition to this direct feedback system, the quadrature accuracy of the divided signals is improved by controlling the speed of the phase-loop high-frequency path itself.

Although certain specific embodiments are described above for instructional purposes, the teachings of this patent document have general applicability and are not limited to the specific embodiments described above. Although the divider of FIG. 4 is described above as being present in local oscillator block 105 of FIG. 2 such that I and Q differential signals are output from block 105, it is understood that the divider of FIG. 4 may be present in mixer block 110. If the divider is present in mixer block 110, then the VCO output signal VON and VOP is supplied from local oscillator block 105 to the divider in mixer block 110 and the I and Q differential signals are generated within mixer block 110. The blocks illustrated in FIG. 2 are functional blocks and do not necessarily represent the physical proximities of the actual circuits represented. Accordingly, various modifications, adaptations, and combinations of the various features of the described specific embodiments can be practiced without departing from the scope of the claims that are set forth below.

What is claimed is:

1. A divide-by-three circuit, comprising:
    a chain of dynamic flip-flops comprising a first flip-flop, a second flip-flop, and a third flip-flop, wherein a signal path extends through the chain of dynamic flip-flops, and wherein the dynamic flip-flops are synchronously clocked by a clock signal; and
    a feedback circuit of combinatorial logic that has a first plurality of input leads coupled to a plurality of first locations along the signal path, a second plurality of input leads coupled to a plurality of second locations along the signal path, a propagation delay control input lead, and an output lead coupled to an input lead of the first flip-flop;
    wherein the plurality of first locations along the signal path comprises a first flip-flop slave stage location and a second flip-flop slave stage location, and the plurality of second locations comprises a first flip-flop master stage location and a second flip-flop slave stage location;
    wherein selection of master and slave mode operation enhances frequency range of the divide-by-three circuit.

2. The divide-by-three circuit of claim 1, wherein a Feedback Signal Propagation Delay Control Signal (FSPDCS) on the propagation delay control input lead causes the feedback circuit to have a propagation delay taken from one of two selectable propagation delays.

3. The divide-by-three circuit of claim 2, wherein if the propagation delay is a first of the two selectable propagation delays then the propagation delay is from a rising edge transition of the clock signal to a corresponding transition of a feedback signal on the output lead of the feedback circuit, whereas if the propagation delay is a second of the two selectable propagation delays then the propagation delay is from a falling edge transition of the clock signal to a corresponding transition of the feedback signal on the output lead of the feedback circuit.

4. The divide-by-three circuit of claim 2, wherein the propagation delay has a first of the two selectable propagation delays if the FSPDCS has a first digital value, whereas the propagation delay has a second of the two selectable propagation delays if the FSPDCS has a second digital value.

5. The divide-by-three circuit of claim 1, wherein the feedback circuit of combinatorial logic also has a third input lead and a fourth input lead, wherein the third input lead is coupled to a third location along the signal path, and wherein the fourth input lead is coupled to a fourth location along the signal path.

6. The divide-by-three circuit of claim 5, wherein the circuit is operable in a first mode and in a second mode, wherein in the first mode the feedback circuit of combinatorial logic outputs a feedback signal onto the output lead of the feedback circuit that is a function of a signal on the first input lead of the feedback circuit and a signal on the second input lead of the feedback circuit, and wherein in the second mode the feedback circuit of combinatorial logic outputs a feedback signal onto the output lead of the feedback circuit that is a function of a signal on the third input lead of the feedback circuit and a signal on the fourth input lead of the feedback circuit.

7. The divide-by-three circuit of claim 1, wherein the first flip-flop includes a master stage and a slave stage, wherein the master stage includes a dynamic portion and a static portion, and wherein the first location along the signal path is an output node of the dynamic portion of the master stage of the first flip-flop.

8. The divide-by-three circuit of claim 1, wherein the first flip-flop includes a master stage and a slave stage, wherein the slave stage includes a dynamic portion and a static portion, and wherein the first location along the signal path is an output node of the dynamic portion of the slave stage of the first flip-flop.

9. A method comprising:
synchronously clocking a chain of dynamic flip-flops, wherein the chain comprises a first flip-flop, a second flip-flop, and a third flip-flop, and wherein a signal path extends through the chain of dynamic flip-flops; and
supplying a propagation delay control signal, a plurality of first signals from a plurality of first locations along the signal path, and a plurality of second signals from a plurality of second locations along the signal path as inputs to combinatorial logic such that the combinatorial logic supplies a feedback signal onto an input lead of the first flip-flop;
wherein the plurality of first locations along the signal path comprises a first flip-flop slave stage location and a second flip-flop slave stage location, and the plurality of second locations comprises a first flip-flop master stage location and a second flip-flop slave stage location;
wherein selection of master and slave mode operation enhances frequency range.

10. The method of claim 9, wherein if the propagation delay control signal has a first digital value then the feedback signal is a combinatorial function of the first signal and the second signal, whereas if the propagation delay control signal has a second digital value then a third signal from a third location along the signal path and a fourth signal from a fourth location along the signal path are supplied as inputs to the combinatorial logic such that the combinatorial logic generates the feedback signal to be a combinatorial function of the third and fourth signals.

11. The method of claim 10, wherein the feedback signal has a propagation delay taken from one of two selectable propagation delays, wherein if the propagation delay control signal has the first digital value then the propagation delay is a first of the two selectable propagation delays, whereas if the propagation delay control signal has the second digital value then the propagation delay is a second of the two selectable propagation delays.

12. The method of claim 10, wherein if the propagation delay is a first of the two selectable propagation delays then the propagation delay is from a rising edge transition of the clock signal to a corresponding transition of the feedback signal, whereas if the propagation delay is a second of the two selectable propagation delays then the propagation delay is from a falling edge transition of the clock signal to a corresponding transition of the feedback signal.

13. The method of claim 10, further comprising:
selecting between a first mode and a second mode, wherein in the first mode the feedback signal that is a combinatorial function of the first signal and the second signal, and wherein in the second mode the feedback signal is a function of the third signal and the fourth signal.

14. A circuit, comprising:
a chain of dynamic flip-flops synchronously clocked by a clock signal, wherein a signal path extends through the chain; and
means for generating a feedback signal as a combinatorial function of a first pair of signals taken from a first pair of locations on the signal path and supplying the feedback signal in a first mode to a flip-flop of the chain such that the circuit divides by three and is operable over a first frequency range, and for generating the feedback signal as a combinatorial function of a second pair of signals taken from a second pair of locations on the signal path and supplying the feedback signal in a second mode to the flip-flop of the chain such that the circuit divides by three and is operable over a second frequency range.

15. The circuit of claim 14, wherein the means is also for receiving a feedback signal propagation delay control signal (FSPDCS), wherein the FSPDCS determines whether the circuit operates in the first mode or in the second mode.

16. The circuit of claim 14, wherein one location of the first pair of locations is in a slave stage of the first flip-flop, and wherein one location of the second pair of locations is in a master stage of the first flip-flop.

* * * * *